(12) United States Patent
Nakajima et al.

(10) Patent No.: US 6,858,076 B1
(45) Date of Patent: Feb. 22, 2005

(54) METHOD AND APPARATUS FOR MANUFACTURING SINGLE-CRYSTAL INGOT

(75) Inventors: Hirotaka Nakajima, Kanagawa (JP);
Toshirou Kotooka, Kanagawa (JP);
Yoshiyuki Shimanuki, Kanagawa (JP);
Hiroshi Inagaki, Kanagawa (JP);
Shigeki Kawashima, Kanagawa (JP);
Makoto Kamogawa, Kanagawa (JP)

(73) Assignee: Komatsu Electronic Metals Co., Ltd., Kanagawa (JP)

( * ) Notice: Subject to any disclaimer, the term of this patent is extended or adjusted under 35 U.S.C. 154(b) by 0 days.

(21) Appl. No.: 09/569,086

(22) Filed: May 10, 2000

(30) Foreign Application Priority Data

| May 11, 1999 | (JP) | 11-129957 |
| Jan. 24, 2000 | (JP) | 2000-014578 |
| Mar. 7, 2000 | (JP) | 2000-061422 |

(51) Int. Cl.[7] ............................................. C30B 13/30
(52) U.S. Cl. ......................... 117/13; 117/14; 117/15; 117/952; 117/208; 117/217
(58) Field of Search .............................. 117/13, 14, 15, 117/35, 208, 217, 952

(56) References Cited

U.S. PATENT DOCUMENTS 5,863,326 A  *  1/1999  Nause et al. ................ 117/217

6,036,776 A  *  3/2000  Kotooka et al. ............ 117/217
6,117,402 A  *  9/2000  Kotooka et al. ............ 117/217

FOREIGN PATENT DOCUMENTS

| EP | 725169-a1 | * 7/1996 | ............ 117/14 |
| JP | 63-256593 | 10/1988 | |
| JP | 2562245 | 9/1996 | |
| JP | 8-239291 | 9/1996 | |
| JP | 11092272 | 4/1999 | |

* cited by examiner

Primary Examiner—Robert Kunemund
(74) Attorney, Agent, or Firm—Welsh & Katz, Ltd.

(57) ABSTRACT

There are provided a system for manufacturing a single-crystal ingot which is equipped with a cooler for cooling the single-crystal ingot being pulled and is capable of forming a tail without involvement of excessive heating of a crucible, as well as to a method for controlling the system. In a system for manufacturing a single-crystal ingot having a cooler for cooling a single-crystal ingot which is being pulled from molten raw material (called a single-crystal pulled ingot), when a tail of the single-crystal pulled ingot is formed, the cooler is moved away from the solid/melt interface between the single-crystal ingot and the molten raw material, to thereby reduce the power dissipated by the system. In the system, the cooler is moved upward after the end of a product area of the single-crystal ingot has been cooled until it passes through a grown-in defect temperature range.

6 Claims, 7 Drawing Sheets

CURVE REPRESENTING THE COOLING OF PULLED CRYSTAL (CALCULATED VALUE)

METHOD AND APPARATUS FOR MANUFACTURING SINGLE-CRYSTAL INGOT

BACKGROUND OF THE INVENTION

1. Field of the Invention

The present invention relates to a system and method for manufacturing a single-crystal ingot (particularly, a single-crystal silicon ingot) by means of the Czochralski technique (hereinafter referred to as the "CZ technique"), and more particularly, to a system for manufacturing a CZ single-crystal silicon ingot equipped with a cooler which consumes comparatively little power.

2. Background Art

[System for Manufacturing a Single-crystal Ingot by Means of the CZ Technique]

A method of pulling a single-crystal ingot by means of the CZ technique pertains to a known technique, and a system for manufacturing a Czochralski single-crystal ingot has already become widespread. According to the CZ technique, manufacture of a single-crystal ingot involves pulling of a single-crystal ingot from molten raw material. There have already been put forward and recently put into practical use several systems for manufacturing a single-crystal ingot which enables high-speed pulling of a single-crystal ingot by increasing the temperature gradient of the single-crystal ingot in the vicinity of the interface between solid and melt (e.g., Japanese Patent Laid-Open Nos. 256593/1988, 239291/1996, and Japanese Paten No. 2562245/1996).

FIG. 7 is a simplified longitudinal cross-sectional view illustrating an example system of known type which manufactures a single-crystal ingot. As shown in FIG. 7, a system 10 of known type comprises a heat-shielding member 12 which surrounds a single-crystal ingot 11 and shields the heat radiated from the level of molten raw material 15 (hereinafter referred to as a "melt 15") and a heater 16, and a cooler 13 for cooling a single-crystal ingot which is being pulled (hereinafter called a "single-crystal pulled ingot 11" or called simply "ingot 11"). The cooler 13 is provided for increasing the axial temperature gradient of the single-crystal pulled ingot 11. In order to improve the efficiency of production of a single-crystal ingot by means of increasing the pull rate of the ingot 11, many current CZ single-crystal ingot systems adopt a cooler.

[Tail of a Single-crystal Ingot]

In the manufacture of a single-crystal ingot employing the CZ technique, after a single-crystal ingot has been grown to a desired length, a reversed-conical neck usually called a tail must be formed. If the single-crystal pulled ingot is abruptly pulled out of the melt 15, a crystal dislocation called slip arises in the ingot (a slip-back phenomenon), and the portion where slip is present cannot be used for manufacturing products.

A length along which the slip-back occurs in the ingot is an ingot diameter when the ingot is disconnected from the melt level, thus causing a slip-back phenomenon. In order to maximize the number of wafers which can be produced as products from an ingot, a tail must be produced by means of carefully tapering the diameter of the ingot in the process of reaching the end of pulling operation, so as to avoid causing a slip-back phenomenon in the portion of the ingot to be sliced into wafers (hereinafter referred to as a "body").

The tail is usually formed to a length equal to the diameter of the body. The reason for this is that if the tail is too short, an area of anomalous oxygen precipitates extends to the body, and the portion of the body where the anomalous oxygen precipitates are present cannot be used for producing wafers. However, the tail cannot be used for producing wafers, and hence an excessively long tail is uneconomical.

A person who is versed in the art well knows that the essential requirement is that a single-crystal ingot shall be pulled to form a tail while the axial temperature gradient of the single-crystal pulled ingot is decreased. To this end, a crucible is usually heated excessively at the time of formation of a tail so as to increase the temperature of the melt, thereby decreasing the temperature gradient of the single-crystal pulled ingot.

However, particularly in a case where the temperature gradient of the single-crystal pulled ingot is intentionally set to be high through use of a cooler, the temperature of the melt must be increased much higher. As a matter of course, such heating of the melt results in an uneconomical increase in power consumption. Further, such heating also induces anomalous heating of a quartz crucible, so that air bubbles existing in the crucible bulge and burst. Broken pieces of the crucible become attached to the single-crystal ingot, thus causing dislocations or rendering the ingot polycrystalline.

In effect, heating the crucible so as to exceed the cooling operation of the cooler requires a large amount of electric power, which in turn requires a larger power unit or involves accelerated deterioration of components provided in the furnace exposed to excessive heat.

In the system of manufacturing a single-crystal ingot, a so-called hot zone of the furnace must be disassembled and cleaned after completion of all the ingot manufacturing processes and removal of a single-crystal ingot from the furnace and before the next processing cycle is started. The hot zone must be sufficiently cooled so that a worker can disassemble the hot zone. Cooling a hot zone of a system of conventional type usually requires six hours or thereabouts, thereby prolonging the per-cycle time required for manufacturing a single-crystal ingot, and deteriorating production efficiency. If the crucible is heated so as to exceed the cooling operation of the cooler, a longer time is required for cooling the hot zone.

The present invention has been conceived to solve the drawbacks in the prior art and is aimed at providing a system for manufacturing a single-crystal ingot which is equipped with a cooler for cooling a single-crystal ingot being pulled and is capable of forming a tail without involvement of excessive heating of a crucible, as well as a method for controlling the system.

As a result of considerable studies in consideration of the foregoing drawbacks, the present inventors have found that a reduction in power consumption and shortening of production time can be achieved, by way of movement of a cooler provided in a single-crystal ingot manufacturing system according to a process of manufacturing a single-crystal ingot, thus completing the present invention.

A reduction in power consumption is primarily achieved by means of moving the cooler away from an interface between a solid and a melt (hereinafter referred to simply as a "solid/melt interface") during formation of a tail. The present invention has been completed as a result of a discovery that a better result is attained when there is taken into consideration occurrence of defectives, such as crystal grown-in defects due to the re-ascent of the temperature of the single crystal.

SUMMARY OF THE INVENTION

More specifically, the present invention provides the following system and method.

(1) A method of controlling a system for manufacturing a single-crystal ingot by means of the Czochralski technique (hereinafter referred to as the "CZ technique"), the system having a cooler provided in a furnace for cooling a predetermined location of a single-crystal ingot which is being pulled from molten raw material (hereinafter referred to as a "single-crystal pulled ingot"), wherein when a tail of the single-crystal pulled ingot is formed, the cooler is moved away from the solid/melt interface between the single-crystal ingot and the molten raw material, to thereby reduce the power dissipated by the system.

This eliminates a necessity for heating a crucible over the cooling operation of the cooler at the time of formation of the tail, thus diminishing power dissipation.

(2) A method of controlling a system for manufacturing a single-crystal ingot by means of the Czochralski technique (hereinafter referred to as the "CZ technique"), the system having a cooler provided in a furnace for cooling a predetermined location of a single-crystal ingot which is being pulled from molten raw material (hereinafter referred to as a "single-crystal pulled ingot"), wherein after the single-crystal ingot has been pulled from the molten raw material, the cooler is moved close to the crucible whose heating has been completed, thus shortening a time required for producing a single-crystal ingot.

Here, the expression "moving the cooler close to the crucible whose heating has been completed" means that the cooler is moved close to a heater which is a heat source of the system, thus cooling the heater. Further, "moving the cooler close to the crucible whose heating has been completed" can be achieved by moving the crucible up relative to the cooler, moving the cooler down relative to the crucible, or moving the crucible up and cooler down in combination relative to each other.

(3) A system for manufacturing a single-crystal ingot by means of the Czochralski technique (hereinafter-referred to as the "CZ technique"), the system having a cooler provided in a furnace for cooling a predetermined location of a single-crystal ingot which is being pulled from molten raw material (hereinafter referred to as a "single-crystal pulled ingot"), wherein when the tail of the single-crystal pulled ingot is formed, the cooler is moved up so as to move away from the solid/melt interface between the single-crystal ingot and the molten raw material.

(4) A system for manufacturing a single-crystal ingot by means of the Czochralski technique (hereinafter referred to as "CZ technique"), the system having a cooler provided in a furnace for cooling a predetermined location of a single-crystal ingot which is being pulled from molten raw material (hereinafter referred to as a "single-crystal pulled ingot"), wherein after the single-crystal ingot has been pulled from the molten raw material, the cooler is moved down in order to cool the crucible whose heating has been completed.

(5) Preferably, the cooler is lowered to the inside of the crucible.

(6) A system for manufacturing a single-crystal ingot by means of the Czochralski technique (hereinafter referred to as the "CZ technique"), the system having a cooler provided in a furnace for cooling a predetermined location of a single-crystal ingot which is being pulled from molten raw material (hereinafter referred to as a "single-crystal pulled ingot"), wherein after the single-crystal ingot has been pulled from the molten raw material, the crucible whose heating has been completed is moved up and close to the cooler, to thereby cool the crucible.

(7) A system for manufacturing a single-crystal ingot by means of the Czochralski technique (hereinafter referred to as the "CZ technique") the system having a cooler provided in a furnace for cooling a predetermined location of a single-crystal ingot which is being pulled from molten raw material (hereinafter referred to as a "single-crystal pulled ingot"), wherein when the tail of the single-crystal pulled ingot is formed, the cooler is moved upward so as to move away from the solid/melt interface between the single-crystal ingot and the molten raw material; and after the single-crystal ingot has been pulled from the molten raw material, so as to cool the crucible whose heating has been completed, the cooler is moved downward and close to the crucible, to thereby crucible is cooled.

(8) A method of manufacturing a single-crystal ingot, through use of a system for manufacturing a single-crystal ingot by means of the Czochralski technique (hereinafter referred to as "CZ technique"), the system having a cooler provided in a furnace for cooling a predetermined location of a single-crystal ingot which is being pulled from molten raw material (hereinafter referred to as a "single-crystal pulled ingot"), wherein the diameter of the single-crystal pulled ingot is controlled by changing the distance from the cooler to the solid/melt interface between the single-crystal ingot and the molten raw material.

The cooler greatly contributes to control of a temperature gradient at a predetermined location of the single-crystal pulled ingot in the direction in which the single-crystal pulled ingot is to be pulled, and greatly affects the state of the single-crystal pulled ingot at the interface between solid and melt. According to the control method of the present invention, if the interval from the cooler to the interface between solid and melt is made smaller, the state of the single-crystal pulled ingot at the interface becomes closer to solid, thereby increasing the diameter of the ingot to be pulled. In contrast, if the interval from the cooler to the interface between solid and melt is made greater, the state of the single-crystal pulled ingot at the interface becomes closer to melt, thereby decreasing the diameter of the ingot to be pulled.

[Prevention of Occurrence of Crystal Grown-in Defects Due to Re-ascent of the Temperature of the Single-crystal Ingot]

The present invention also takes into consideration occurrence of defectives, such as crystal grown-in defects due to re-ascent of the temperature of the single-crystal ingot, which would arise when the cooler is moved away from the solid/melt interface during formation of a tail. In the present invention, if the cooler is immediately moved away from the single-crystal ingot as a result of paying attention solely to a reduction in power consumption, the effect of the cooler for cooling a crystal is abruptly diminished, thereby resulting in a reduction in the speed at which a crystal is cooled when a hot area whose temperature is higher than a grown-in defect formation temperature passes through a grown-in defect formation temperature range. As a result, the density or size of crystal grown-in defects differs from an intended density or size (more specifically, the crystal grown-in defects would be smaller in density and greater in size). There will arise a problem of the crystal grown-in defects extending to the area of the single-crystal ingot to be used for manufacturing wafers (hereinafter referred to simply as a "wafer area," and this phenomenon is referred to as a kind of runaway phenomenon, due to abrupt loss of the controlling the crystal temperature by the cooler).

If the cooler is immediately moved away from the interface between the solid and melt, the effect of the cooler for cooling the ingot is decreased, the temperature of the portion of the single-crystal ingot which has passed through the grown-in defect formation temperature range would again increase to the crystal grown-in defect formation temperature, thereby posing a problem of regrowth of minute grown-in defects (this problem is called a rebound phenomenon). Consequently, the wafer area of the single-crystal ingot is decreased.

The inventors have found that, in order to avoid occurrence of such a problem (i.e., a runaway phenomenon or a rebound phenomenon), the cooler must be moved upward after the end of the wafer area of the single-crystal pulled ingot has been cooled until it passes through the grown-in defect formation temperature range while power consumption is reduced.

Delay in the timing at which the cooler is moved upward enables avoidance of a reduction in the wafer area of the single-crystal pulled ingot. However, power consumption is increased by the amount corresponding to the delay in the timing at which the cooler is moved upward. In order to optimize final costs required for producing wafers, there must be achieved a balance between an increase in power consumption due to a delay in the timing at which the cooler is moved upward and an increase in the wafer area of the single-crystal ingot.

In consideration of these, the present invention provides the following:

(9) Preferably, the wafer area of the single-crystal pulled ingot is increased by means of delaying the timing at which the cooler is moved away from the solid/melt interface between the single-crystal ingot and the molten raw material.

(10) Preferably, the timing at which the cooler is moved upward is controlled in consideration of a balance between the saving in power consumption stemming from movement of the cooler away from the solid/melt interface between the single-crystal ingot and the molten raw material and an increase in the wafer a area due to a delay in the timing at which the cooler is moved away, thereby optimizing the economy of wafer production.

(11) Preferably, after the end of the wafer area of the single-crystal pulled ingot has been cooled until it passes through the grown-in defect formation temperature range, the cooler is moved upward.

The present invention may be embodied as follows:

(12) Preferably, the system for manufacturing a CZ single-crystal ingot corresponds to a system for manufacturing a single-crystal silicon ingot.

(13) Preferably, the cooler is moved upward at a variable speed.

Preferably, the end of the wafer area of the single-crystal pulled ingot is cooled until it passes through the grown-in defect formation temperature range, by means of lowering the crucible at a speed at which a tail is not detached (for example, a speed of 1 mm/min. or less).

(14) Preferably, the system for manufacturing a CZ single-crystal ingot has a mechanism for lowering the crucible when the end of the wafer area of the single-crystal pulled ingot is cooled until it passes through the grown-in defect formation temperature range.

[Operation of the System for Manufacturing a Single-crystal Ingot]

When a tail of the single-crystal pull-up ingot is formed, there is monitored whether or not the diameter of the single-crystal ingot is decreased at a desired ratio. The system is operated so as to tail off the diameter of the single-crystal pulled ingot by means of changing the distance from the cooler to the surface of the molten raw material.

Control of the system for realizing the above-described operation is usually embodied by means of so-called feedback control. More specifically, the diameter of the single-crystal pulled ingot is actually measured, and the thus-obtained measurement result is compared with an expected diameter. The system can be configured such that if a difference exists between the measured value and the expected value, the system is guided (or automatically controlled) so as to attain a desired, specified diameter by means of changing pulling conditions. Even at the time of formation of a tail, the system is controlled by use of feedback control, thereby enabling formation of a tail of desired length and cone angle.

After pulling of the single-crystal pulled ingot has been completed, the cooler located in an elevated position is automatically controlled so as to move back down to the predetermined position or a position lower than the predetermined position, to thereby cool a hot zone. In this way, the cooler which has been moved up during the course of formation of the tail is moved down to the inside of the furnace after pulling of the single-crystal pulled ingot, thereby enabling forced cooling of a hot zone.

[Definitions of Terms]

The system for manufacturing a single-crystal ingot and the method of controlling the system according to the present invention involve no factors which would be affected by the type of single-crystal ingot to be pulled. In other words, the: system and the method are considered to be commonly applicable to CZ methods, and the single-crystal ingot to be pulled is not limited to a single-crystal silicon ingot.

Throughout the specification, the term "temperature gradient" signifies the degree of change in the temperature with respect to the longitudinal of a single-crystal ingot being pulled from a crucible. A high (or large) temperature gradient indicates a steep thermal change, and a low (or small) temperature gradient indicates a gentle thermal change.

Throughout the specification, the term "hot zone" signifies a portion in a furnace of the system which is to be heated by a heater (primarily corresponding to a portion lower than a heat-shielding member).

The term "grown-in defect formation temperature range" signifies a temperature range at which an axial temperature gradient (° C./mm) is conducive to formation of grown-in defects in an ingot during growth of the ingot, particularly formation of void type defects. More specifically, "grown-in defect formation temperature range" corresponds to a temperature range close to 1120° C. (substantially a temperature range of 1080° C.–1150° C.) of the single-crystal silicon pulled ingot.

BRIEF DESCRIPTION OF THE DRAWINGS

FIGS. 6A and 6B are drawings for describing the principle of the present invention, wherein FIG. 6A is a graph showing the relationship between the distance of the single-crystal pulled ingot from the melt and the temperature of the single-crystal pulled ingot, and FIG. 6B is a schematic representation for supplementally explaining the graph shown in FIG. 6A.

BEST MODE FOR CARRYING OUT THE INVENTION

Figure 1:
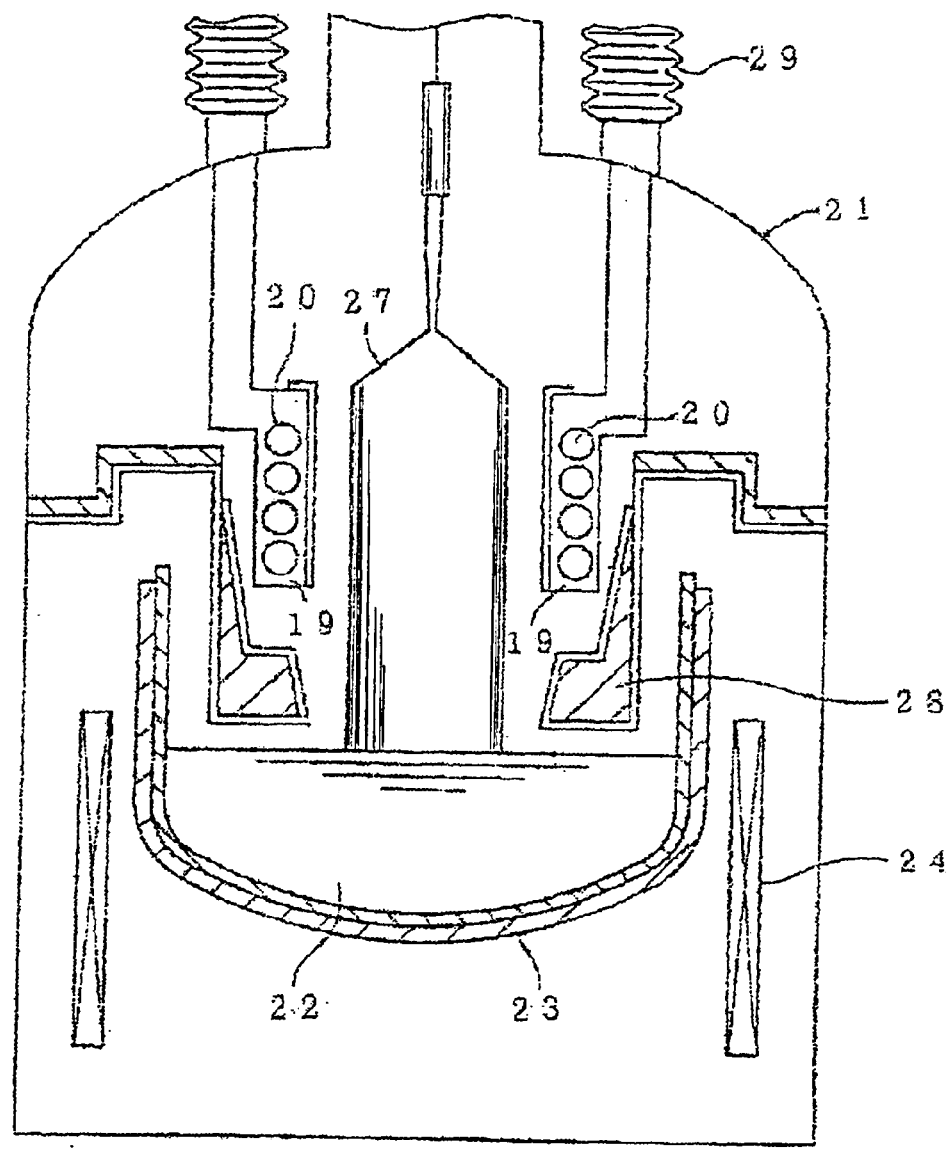
FIG. 1 is a longitudinal cross-sectional view showing a system for manufacturing a single-crystal ingot according to the present invention.

FIG. 1 is a simplified longitudinal cross-sectional view showing a preferred embodiment of a system for manufacturing a single-crystal silicon ingot according to the present invention. A preferred embodiment of the present invention will now be described by reference to FIG. 1.

[General Structure]

A system for manufacturing a single-crystal silicon ingot (hereinafter referred to simply as a "system") according to the present invention comprises a chamber 21 which is formed from a closed container; a crucible 23 disposed in the chamber 21 for producing and storing a silicon melt 22; and a heater 24 disposed in the chamber 21 for heating the crucible 23, as in the case of an ordinary Czochralski system for manufacturing a single-crystal silicon ingot (hereinafter referred to simply as an "ordinary system"). The system is further provided with an electrode for supplying power to the heater 24, a crucible receiver for supporting the crucible 23, a pedestal for rotating the crucible 23, a crucible elevator for moving the crucible 23 up and down, thermally insulating material, a melt receiver, and an internal cylinder, as in the case of the ordinary system. For brevity, these elements are omitted from the drawings. The system is also provided with a heat-shielding member 28 for protecting a silicon ingot 27 from the heat radiated from the silicon melt 22 and the heater 24, and a cooler 19 located inside the heat-shielding member 28.

Although omitted from the drawings, there is also provided a system for feeding and exhausting inactive gas usually provided for a system of this type. The heat-shielding member 28 doubles as a device for regulating an inactive gas flow channel.

[Cooler]

The system of the present invention is characterized in that the cooler 19 including a pipe through which cooling water circulates is provided, in a vertically movable manner, inside the heat-shielding member 28. In the present embodiment, a a helical cooling water pipe 20 is accommodated in a cylindrical section of the cooler 19 which surrounds a single-crystal ingot being pulled (hereinafter called a "single-crystal pulled ingot"). The cooler 19 can be moved up and down with respect to the axial direction of the ingot, by means of a cooler elevation mechanism (not shown) disposed outside the chamber 21 (see Japanese Patent application No. 275097/1997). Mechanical means for embodying such an elevation mechanism corresponds to, for example, a ball screw and a rod. However, the elevation mechanism is not limited to the mechanical means embodied by a ball screw and a rod.

Cooling water which circulates through the cooling water pipe 20 accommodated in the cooler 19 is supplied from a feed pipe (not shown). Bellows 29 are attached to portions of the chamber 21 from which a plumbing fixture including the feed pipe is guided into the chamber 21, thus maintaining the air-tightness integrity and flexibility of the chamber 21. During the course of formation of a body, the cooler 19 is fixedly located at a single position in order to appropriately control a temperature gradient at a predetermined location of the single-crystal pulled ingot closely relevant to formation of crystal grown-in defects.

[Formation of a Tail]

Figure 2:
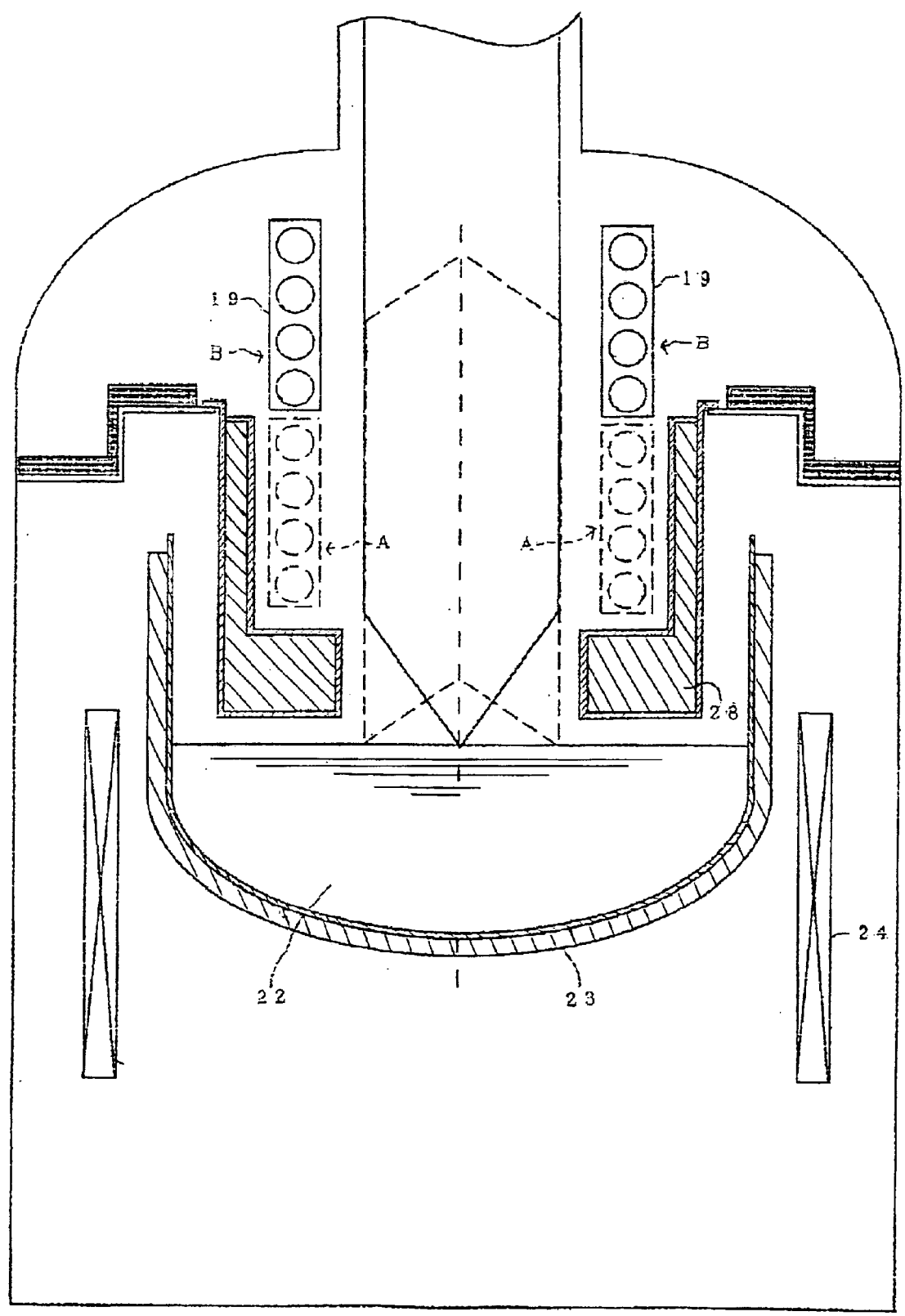
FIG. 2 is a longitudinal cross-sectional view showing the operation of the system.

Next will be described a procedure for forming a tail through use of the system according to the present invention, by reference to FIG. 2. For brevity, members which are not directly relevant to the description of the invention are omitted from the drawings.

As mentioned above, during the course of formation of a body, the cooler 19 is fixedly located at position A such that a desired temperature gradient is attained at a predetermined location of the single-crystal pulled ingot. When processing shifts to a process for forming a tail, the cooler 19 is moved up to position B thereby increasing the distance between the cooler 19 and a melt level. As a result, the diameter of the ingot being pulled is gradually tailed off.

Preferably, the cooler 19 is moved up to position B not abruptly but gradually. If the distance between the melt level and the cooler 19 is increased abruptly, a change arises in the thermal budget of the body, thus inducing two areas of anomalous oxygen precipitates.

Although the above-described process may be effected by means of an operator manually operating the system while visually monitoring the same, the process is usually effected according to an automatic control method.

[Flow of Operations for Forming a Tail]

Figure 3:
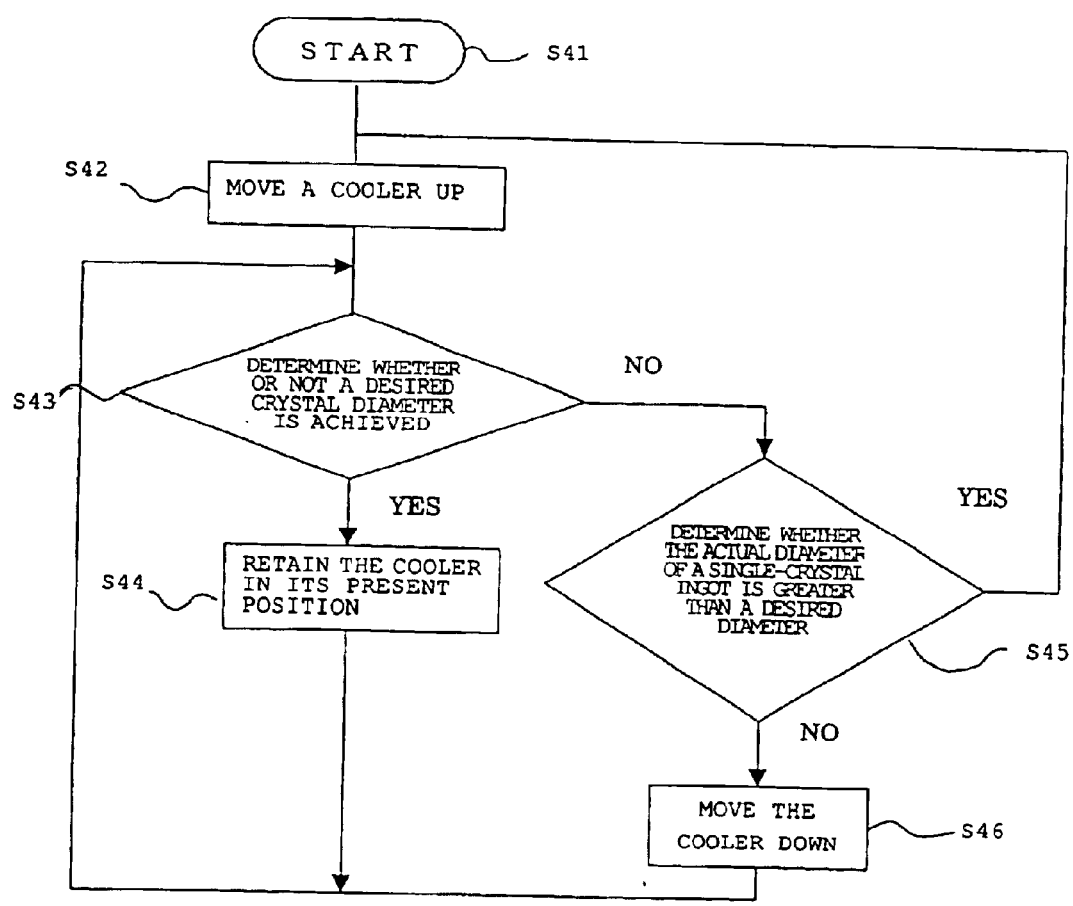
FIG. 3 is a flowchart showing the flow of processes for controlling the system.

FIG. 3 is a flowchart showing processes of automatic feedback control applicable to the present invention. The flow of control is described with reference to FIG. 3.

When formation of a tail is commenced (S41), a cooler elevation mechanism is actuated, to thereby move the cooler 19 up by only a predetermined distance (S42). The diameter of the single-crystal pulled ingot actually measured is compared with a desired diameter (S43). In a case where the comparison result shows that a desired diameter is achieved, the cooler 19 is retained at its present position (S44). However, if the comparison result shows that a desired diameter is not achieved, a determination is made as to whether the actually-measured diameter of the single-crystal pulled ingot is larger or smaller than the desired diameter (S45). In a case where the actually-measured diameter of the single-crystal pulled ingot is larger than the desired diameter, processing returns to step S42, where the cooler 19 is elevated further. Processing pertaining to subsequent steps is then repeated.

In a case where the actually-measured diameter of the single-crystal pulled ingot is smaller than a desired value, the cooler 19 is moved down by only a required distance (S46). Control processing returns to step S43, where a comparison is made between the actually-measured diameter of the single-crystal pulled ingot and a desired diameter.

Repetition of the control processing enables formation of a tail which meets given requirements. In the embodiment, the cooler 19 is moved up and down by means of an elevation mechanism. However, there may also be adopted another method for increasing the distance between the melt level and the cooler 19, i.e., vertical movement of the crucible 23. Further, vertical movement of the cooler 19 and vertical movement of the crucible 23 may be employed in combination. Here, the crucible 23 is moved up and down by means of an unillustrated crucible elevator. The crucible 23 can be freely moved up and down by operation of the crucible elevator. The unillustrated crucible elevator may be operated by an operator or according to an automatic feedback control method such as that mentioned previously. The same also applies to a case where vertical movement of the cooler 19 and vertical movement of the crucible 23 are employed in combination.

[Result]

Figure 4:
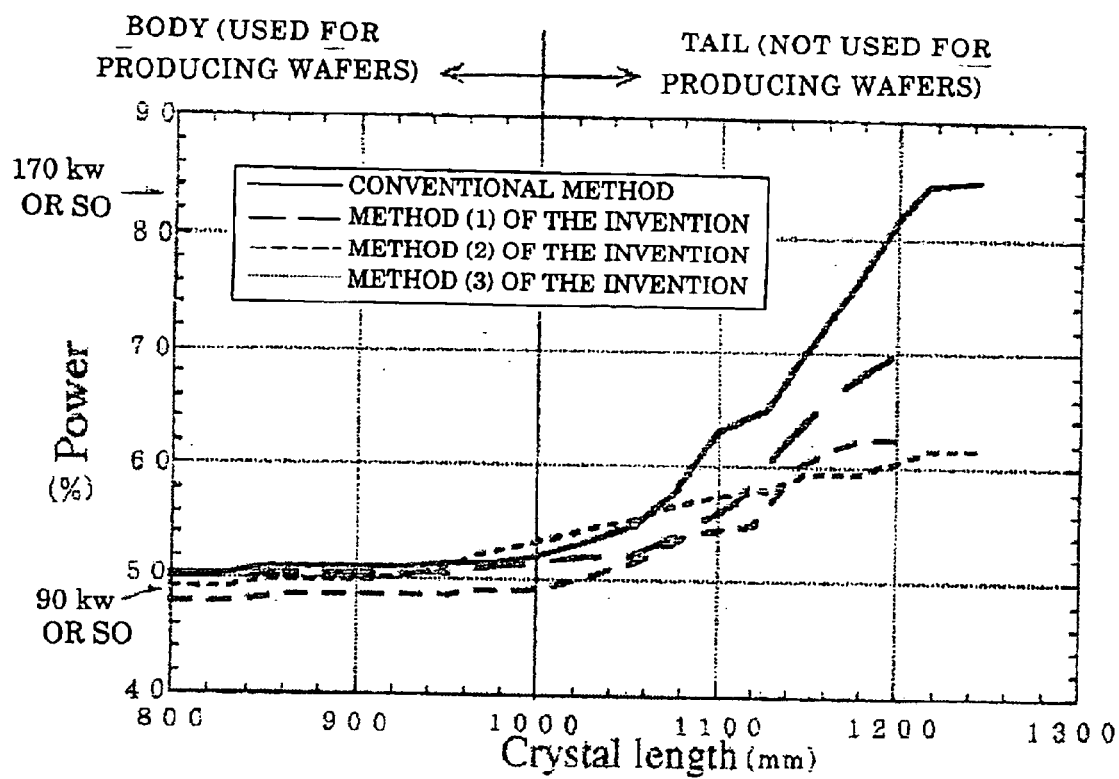
FIG. 4 is a graph showing single-crystal ingots produced by controlling the system according to a conventional control method and control methods of the present invention.

FIG. 4 and Table 1 show results for single-crystal ingots produced while the cooler 19 was moved away from the solid/melt interface between the single-crystal ingot and the molten raw material, according to a conventional method and according to methods of the present invention; specifically, (1) a method of moving the cooler 19 up through use of the cooler elevation mechanism; (2) a method of moving the crucible 23 down through use of the crucible elevator; and (3) a combination of methods (1) and (2).

TABLE 1

|  | Number of Single-crystal Ingots Pulled | Number of Tails Including Dislocations | Number of Graphite Crucibles Used |
| --- | --- | --- | --- |
| Conventional method | 20 | 12 | 2 |
| Method (1) of the invention | 20 | 3 | 1 |
| Method (2) of the invention | 20 | 0 | 1 |
| Method (3) of the invention | 20 | 1 | 1 |

As can be seen from FIG. 4, in contrast with the conventional method, the methods of the present invention enable a considerable-reduction in power consumption. Further, as is evident from Table 1, the methods of the present invention enable a reduction in the number of tails including dislocations, thus improving the yield of single-crystal ingots. Simultaneously, overheating of the crucible can be avoided in association with a reduction in power consumption, and hence the load imposed on the graphite crucible becomes smaller. Further, it is also seen that in a case where the same number of single-crystal ingots are pulled, a smaller number of graphite crucibles are required, thus achieving increased economy.

[Delay in the Timing at which the Cooler is Moved Upward]

In order to avoid occurrence of a decrease in the wafer area of the single-crystal ingot, in the present embodiment the cooler 19 is moved upward after the end of the wafer area of the single-crystal pulled ingot has been cooled until the possibility of the temperature of the end of the wafer area re-ascending to the grown-in defect formation temperature within the CZ furnace is eliminated. This will now be described in detailed hereinbelow.

Figure 6A:
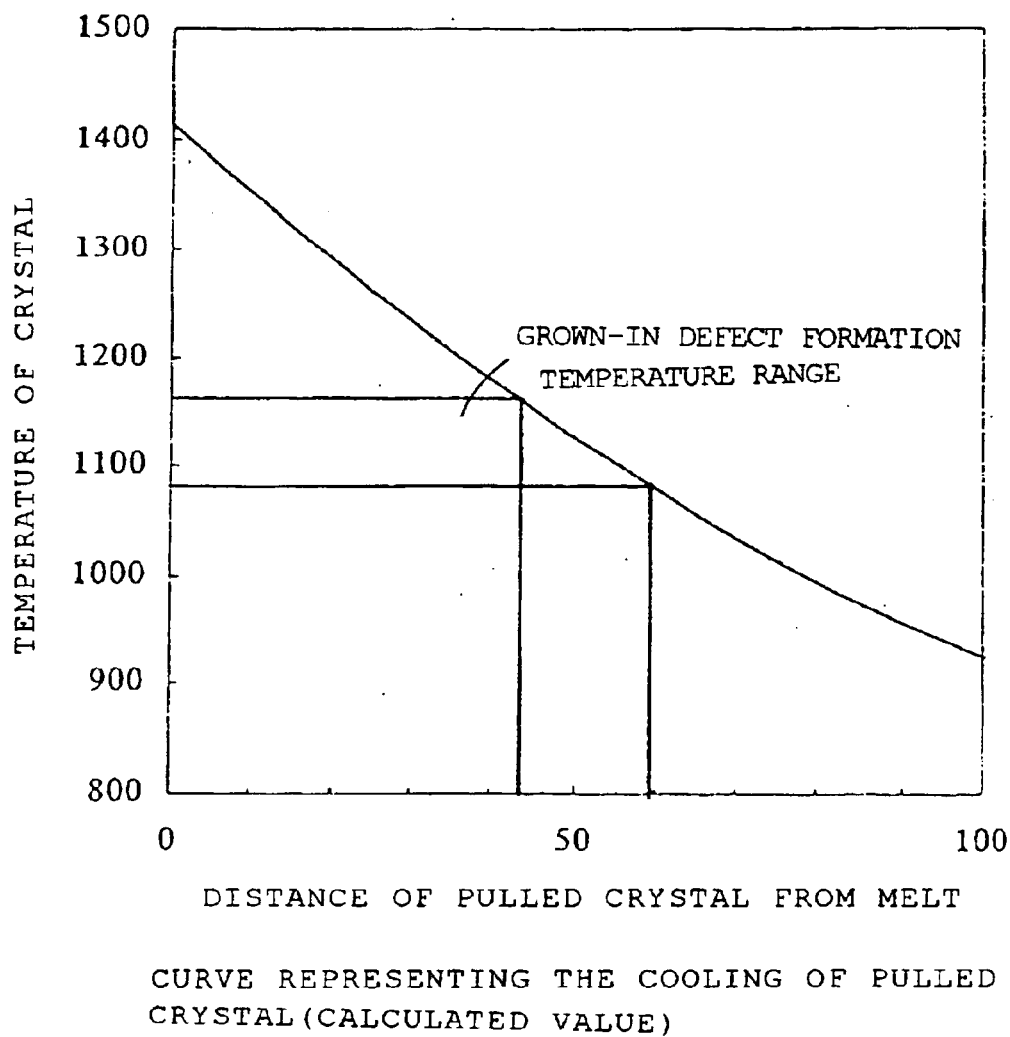
Figure 6B:
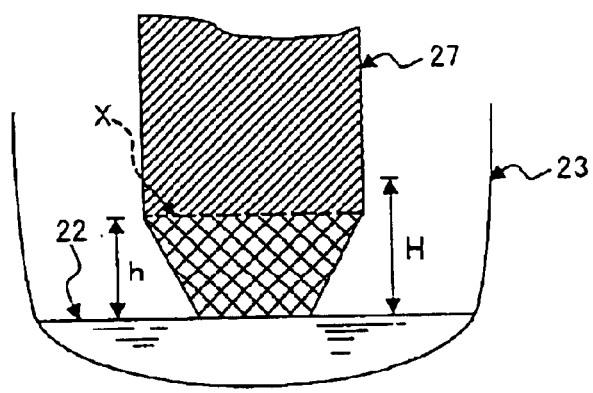
Figure 7:
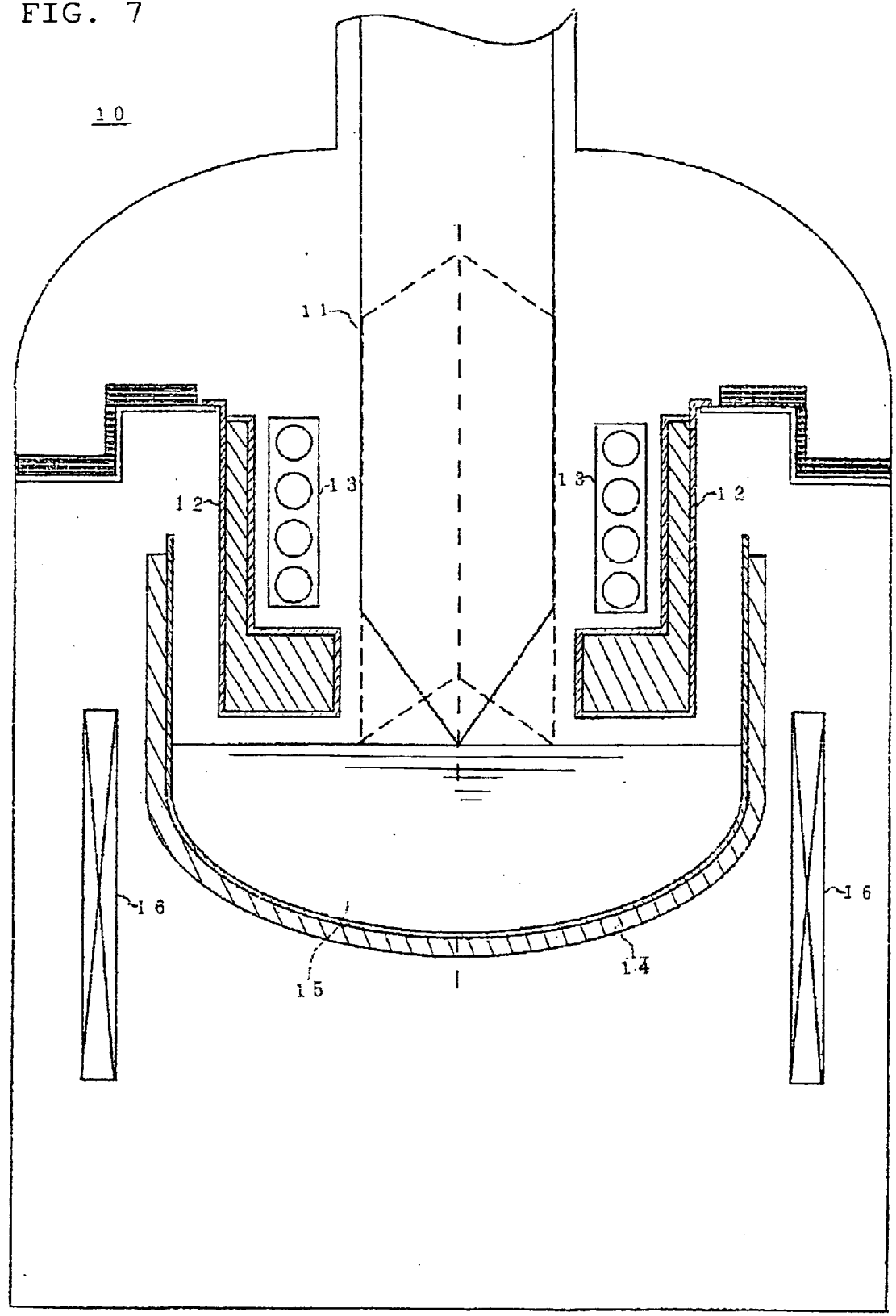
FIG. 7 is a simplified longitudinal cross-sectional view showing a system of conventional type for manufacturing a single-crystal ingot.

FIGS. 6A and 6B are drawings for describing the principle of the present invention. FIG. 6A is a graph showing the relationship between the distance of the single-crystal pulled ingot from the melt and the temperature of the single-crystal pulled ingot. FIG. 6B is a schematic representation for supplementally explaining the graph shown in FIG. 6A. In FIGS. 6A and 6B, like reference numerals designate like elements.

FIG. 6A shows a grown-in defect formation temperature range [a temperature range close to 1120° C. of the single-crystal pulled silicon ingot (ranging from about 1080° C. to 1150° C.)]. As shown in FIG. 6A, a height (designated by H in FIG. 6B) corresponding to the grown-in defect formation temperature range ranges from about 43 mm to about 60 mm. Accordingly, so long as the cooler 19 is moved-upward after the end X of the wafer area (corresponding to a hatched portion shown in FIG. 6B) has been moved a distance "h" of about 60 mm away from the melt, there can be avoided occurrence of a decrease in the wafer area of the single-crystal ingot, which would otherwise be caused by the runaway phenomenon in which grown-in defects arise as a result of abrupt loss of control of the cooler's temperature (i.e., a problem of grown-in defects arising in the area of the single-crystal ingot whose temperature is higher than the grown-in defect formation temperature as a result of the cooler losing the control of a cooling speed). Simultaneously, a decrease in the wafer area of the single-crystal ingot, which would otherwise be caused by the rebound phenomenon, can be avoided. Accordingly, in the present embodiment, even when the power consumption is reduced by means of moving upward the cooler 19 during formation of a tail (corresponding to a hatched area shown in FIG. 6B), the cooler 19 is moved upward after the end X of the wafer area has been moved an expected distance "h" of 60 mm away from the melt.

[Forced Cooling of a Hot Zone]

Forced cooling of a hot zone through use of the cooler 19 after completion of pulling of the single-crystal ingot will now be described.

Figure 5:
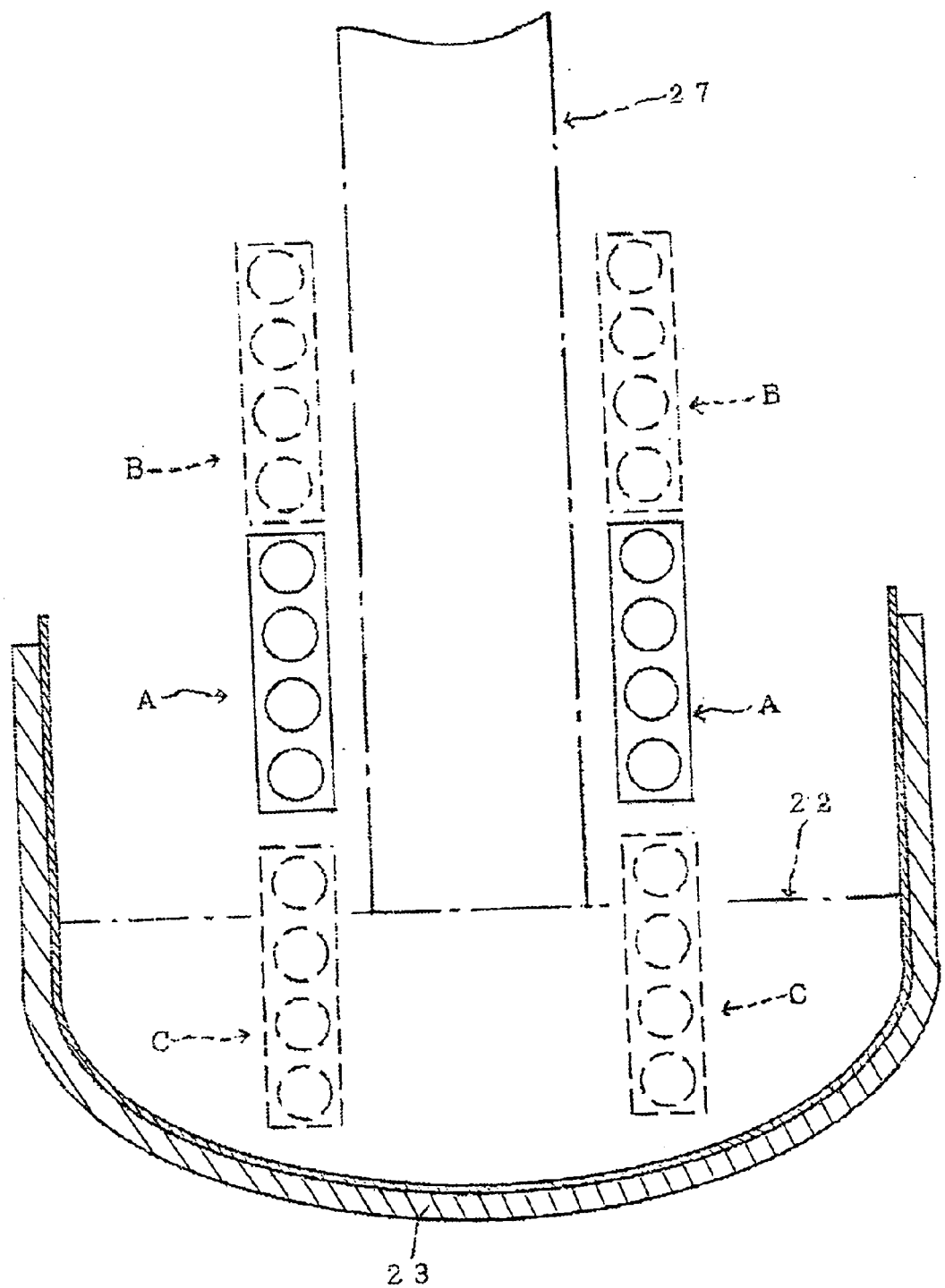
FIG. 5 is a schematic representation for describing forced cooling of a hot zone.

After completion of formation of the tail, the process for manufacturing a single-crystal ingot is completed. As shown in FIG. 5, after completion of formation of the tail, the cooler 19 located at an elevated position is moved back down toward the crucible 23 (indicated by C in the drawing), thus force fully cooling the hot zone comprising of the crucible 23. As a result, the time required for a shift pulling of the next single-crystal ingot can be shortened, thus shortening the overall manufacturing cycle.

Of the components provided inside the hot zone of the furnace, the crucible 23 has the highest temperature. Hence, the cooler 19 is desirably moved as close to the crucible 23 as possible, thus promoting cooling of the crucible 23. In a case where the heat-shielding member 28 hinders downward movement of the cooler 19, the heat-shielding member 28 may be moved down together with the cooler 19 or may be moved in the outward direction of the furnace so as to enable downward movement of the cooler 19.

As has been described above, the system for manufacturing a single-crystal ingot, the method of controlling the system, and the method of manufacturing a single-crystal ingot according to the present invention, enable stable pulling of a single-crystal ingot and a reduction in power consumption at the time of formation of a tail of a single-crystal ingot.

Further, the heating value applied to the crucible during the formation of a tail can be reduced, and hence the load applied to components provided in the furnace, typified by a crucible, can be reduced, thus prolonging the life of components.

The system and the control method according to the present invention enables shortening of the time required for cooling a hot zone after manufacture of a single-crystal ingot, as well as shortening (or rendering more efficient) a cycle of manufacture of a single-crystal ingot.

We claim:

1. A method of controlling a system for manufacturing a single-crystal ingot by means of the Czochralski technique, the system having a cooler provided in a furnace for cooling a predetermined location of a single-crystal ingot which is being pulled from molten raw material, wherein when a tail of the single-crystal pulled ingot is formed the cooler is moved up in correspondence with a pulling-up amount of the single-crystal ingot.

2. A method of controlling a system for manufacturing a single-crystal ingot according to claim 1, wherein after the single-crystal ingot has been pulled from the molten raw material, the cooler is moved close to the crucible whose heating has been completed.

3. The method as defined in claim 1, wherein, when the cooler is moved away from the solid/melt interface between the single-crystal ingot and the molten raw material, a timing at which the cooler is moved away from the solid/melt interface is delayed, to thereby increase an area of the single-crystal pulled ingot to be used for manufacturing products.

4. The method as defined in claim 3, wherein the timing at which the cooler is moved upward is controlled in consideration of a balance between the saving in power consumption stemming from movement of the cooler away from the solid/melt interface between the single-crystal ingot and molten raw material and an increase in the area of the single-crystal ingot to be used for manufacturing products due to a delay in the timing at which the cooler is moved away, thereby optimizing the economy of wafer production.

5. A method of manufacturing a single-crystal ingot, through use of a system for manufacturing a single-crystal ingot by means of the Czochralski technique, the system having a cooler provided in a furnace for cooling a predetermined location of a single-crystal ingot which is being pulled from molten raw material, wherein a diameter of the single-crystal pulled ingot is controlled by changing a distance from the cooler to a solid/melt interface between the single-crystal pulled ingot and the molten raw material.

6. A method of controlling a system for manufacturing a single-crystal ingot by means of the Czochralski technique, the system having a cooler provided in a furnace for cooling a predetermined location of a single-crystal ingot which is being pulled from molten raw material, wherein when a tail of the single-crystal pulled ingot is formed the cooler is moved away from a solid/melt interface between the single-crystal ingot and the molten raw material to maintain a desired diameter of the single-crystal pulled ingot.

* * * * *